United States Patent
Clement et al.

(10) Patent No.: US 12,237,098 B2
(45) Date of Patent: Feb. 25, 2025

(54) MAGNETIC SHIELDING SHEATH FOR AN ELECTRICAL CABLE

(71) Applicant: TRESSE INDUSTRIE, Ambert (FR)

(72) Inventors: Gilles Clement, Ambert (FR); Pierre Omerin, Ambert (FR)

(73) Assignee: TRESSE INDUSTRIE, Ambert (FR)

( * ) Notice: Subject to any disclaimer, the term of this patent is extended or adjusted under 35 U.S.C. 154(b) by 454 days.

(21) Appl. No.: 17/440,443

(22) PCT Filed: Mar. 16, 2020

(86) PCT No.: PCT/FR2020/050551
§ 371 (c)(1),
(2) Date: Sep. 17, 2021

(87) PCT Pub. No.: WO2020/188213
PCT Pub. Date: Sep. 24, 2020

(65) Prior Publication Data
US 2022/0165456 A1  May 26, 2022

(30) Foreign Application Priority Data
Mar. 19, 2019  (FR) .................................... 1902827

(51) Int. Cl.
*H01B 13/22* (2006.01)
*H02G 3/04* (2006.01)
*H05K 9/00* (2006.01)

(52) U.S. Cl.
CPC .......... *H01B 13/22* (2013.01); *H02G 3/0481* (2013.01); *H05K 9/0083* (2013.01)

(58) Field of Classification Search
CPC .......... H01B 7/28; H01B 7/282; H01B 7/365; H01B 9/03; H01B 13/22; H02G 3/0481; H05K 9/0083; H01R 9/03; H01R 13/64
USPC ................ 174/36, DIG. 11, 74 R, 74 A, 82, 174/102 R–110 R; 428/36.1, 99, 100, 428/192, 193, 36.9, 36.92, 34.1–34.5; 264/629; 139/384 R, 433
See application file for complete search history.

(56) References Cited

U.S. PATENT DOCUMENTS

| | | | | |
|---|---|---|---|---|
| 4,891,256 A * | 1/1990 | Kite, III | ............... | H02G 3/0481 174/DIG. 11 |
| 5,012,125 A | 4/1991 | Conway | | |
| 6,583,352 B2 * | 6/2003 | Fukushima | ............ | H02G 3/088 439/271 |
| 6,639,148 B2 * | 10/2003 | Marks | .................. | H05K 9/0098 174/117 M |
| 8,283,563 B2 | 10/2012 | Harris et al. | | |
| 8,502,069 B2 * | 8/2013 | Holland | .................. | H02G 15/18 57/212 |
| 8,875,746 B2 * | 11/2014 | Harris | ...................... | D02G 3/38 139/420 R |
| 9,496,071 B2 | 11/2016 | Nagahashi | | |
| 2007/0159753 A1 * | 7/2007 | Randall | .................. | H05K 9/009 361/111 |
| 2007/0275199 A1 * | 11/2007 | Chen | ...................... | H01C 1/028 428/36.1 |
| 2009/0098779 A1 * | 4/2009 | Kawamura | ...... | H01R 13/65912 439/733.1 |
| 2009/0218002 A1 * | 9/2009 | Kashihara | ............ | D03D 1/0043 139/384 R |
| 2010/0084179 A1 * | 4/2010 | Harris | .................. | D03D 1/0043 174/126.1 |
| 2014/0262478 A1 * | 9/2014 | Harris | .................. | D03D 15/567 139/420 R |
| 2015/0155638 A1 * | 6/2015 | Nagahashi | ............. | H01R 4/203 174/74 R |
| 2016/0358690 A1 * | 12/2016 | Liu | ...................... | D03D 1/0058 |
| 2019/0176721 A1 * | 6/2019 | Fan | .......................... | H01B 7/36 |

FOREIGN PATENT DOCUMENTS

| | | |
|---|---|---|
| DE | 102014104290 A1 | 10/2015 |
| DE | 102016107453 A1 | 10/2017 |
| EP | 2869416 A2 | 5/2015 |
| EP | 2903006 A1 | 8/2015 |
| JP | S61168809 A | 7/1986 |
| JP | 2004214137 A | 7/2004 |
| JP | 2006216338 A | 8/2006 |
| JP | 2011187702 A | 9/2011 |
| JP | 2018156925 A | 10/2018 |
| WO | 02054554 A1 | 7/2002 |
| WO | 2007117883 A2 | 10/2007 |

OTHER PUBLICATIONS

International Search Report issued Jul. 29, 2020 re: Application No. PCT/FR2020/050551, pp. 1-2, citing: WO 2007117883 A2, EP 2903006 A1, WO 02054554 A1 and JP 2004214137 A.
Japanese Office Action for Application No. 2021-556385, dated Apr. 14, 2024, 17 pages with English translation.
European Summons to Oral Proceedings for Application No. 20 726 207.2, dated Jul. 24, 2024, 27 pages with translation.

* cited by examiner

*Primary Examiner* — William H. Mayo, III
(74) *Attorney, Agent, or Firm* — CANTOR COLBURN LLP

(57) ABSTRACT

The sheath forms, in the mounted state, a flexible tubular casing configured to receive the cable.
The sheath includes elongated elements such as wires or strips, which include elongated elements of a first type, made of at least one electrically conductive material; and elongated elements of a second type, different from the first type, made of at least one material having sufficient magnetic properties to produce the shielding effect. The elongated elements are assembled in a crisscross manner and/or forming an encircling, and the sheath is produced in the form of an initially substantially flat sheet, suitable for being wound around the cable.

22 Claims, 6 Drawing Sheets

MAGNETIC SHIELDING SHEATH FOR AN ELECTRICAL CABLE

TECHNICAL FIELD

The present disclosure concerns a magnetic shielding sheath for an electric cable.

Some installations include one or more objects that generate an electromagnetic field that could interfere with the proper functioning of certain electric or electronic equipment and/or be harmful to people in the vicinity. It is then known to put in place a shielding, which forms a barrier between the source object of this electromagnetic field and the equipment or people to be protected.

The disclosure more specifically concerns the shielding of a cable, that is to say the shielding against an electromagnetic field emitted by a cable traversed by a current. In direct current, or at low or even very low frequency (in the range of 0 Hz to 500 kHz), the dominant of this field is magnetic.

The disclosure applies in particular, but not exclusively, to hybrid vehicles, that is to say including, in addition to a heat engine, an electric motor linked to a generator such as a battery. The electric assembly is typically of the common mode type, that is to say that the current returns to the generator via the ground. In practice, the chassis of the vehicle constitutes the ground plane.

In this application, the electromagnetic field comes from the cable, which is crossed by a strong permanent current, and can further be punctually crossed by peaks of inrush current of very short duration (a few milliseconds) but of very high intensity (for example in the range of 500 to 600 A), typically during start-up. It is these inrush current peaks that generate the strongest magnetic field, against which shielding is crucial.

BACKGROUND

Known magnetic shielding solutions are based on the production of cabinets, which is unthinkable in the confined space of a vehicle passenger compartment. Furthermore, these methods implement materials with a very high relative permeability µr, such as mumetal or permalloy, which are difficult to mold, except for carrying out very expensive treatment operations. Thus, these magnetic shielding solutions are not suitable for all installations, and in particular cannot be transposed to the shielding of a cable in a vehicle.

SUMMARY

The present disclosure aims to remedy all or part of the drawbacks mentioned above, by providing an improved solution for the magnetic shielding of electric cables.

To this end, and according to a first aspect, the disclosure concerns a magnetic shielding sheath for an electric cable, the sheath forming, in the mounted state, a flexible tubular casing configured to receive the cable. The sheath comprises elongated elements, such as wires or strips, which include:
  elongated elements of a first type, made of at least one electrically conductive material;
  and elongated elements of a second type, different from the first type, made of at least one material having sufficient magnetic properties to produce the shielding effect.

In addition, said elongated elements are assembled in a crisscross manner and/or forming an encircling, and the sheath is produced in the form of an initially substantially flat sheet, suitable for being wound around the cable.

The disclosure thus provides shielding against the electromagnetic field emitted by the cable housed in the sheath, in particular against the magnetic component of this field.

Concretely, thanks to the elongated elements made of an electrically conductive material, the sheath forms a return conductor for the current carried out by the cable housed in the sheath. In the application to a vehicle whose chassis forms the ground plane, the return path to the generator is preferably formed substantially exclusively by this sheath rather than by the chassis, insofar as the latter has a heterogeneous structure (presence of welding, orifices, slots; assembly of parts made of different materials, possibly non-metallic) and therefore has a high impedance. It follows that the current in the shielding sheath creates a magnetic field opposite to the disturbing magnetic field created by the current flowing in the cable and allows it to be partially attenuated. The magnetic field resulting from the sum of the disturbing field and the field created by the return current in the sheath is therefore less intense. This attenuation is all the more important as the sheath and the cable are close to each other.

Moreover, the elongated elements made of a material having magnetic properties make it possible to provide the shielding against the resulting magnetic field.

The use of elongated elements and their assembly method by winding or crisscrossing has many advantages. In particular, this makes it possible to obtain a flexible structure, that is to say that the sheath has a flexibility allowing it to be deformed, to follow the path of the cable and to be adapted to the spatial constraints of the installation in which it is implemented. Forming the material in elongated elements makes it possible to preserve their magnetic properties or to restore them by suitable treatments, at an acceptable cost.

According to one possible embodiment, the sheath is constituted by such an assembly of elongated elements.

In practice, the term «type» can refer to the material constituting the elongated elements, from which the conductivity properties and the magnetic properties derive. It can also refer to the structure or geometry of elongated elements (such as the shape or diameter of these elements).

When it comes to assembling the elongated elements, crisscross assembly means that the flexible elements are crossed together several times; the encircling assembly means that the flexible elements surround the cable several times, possibly with some tightening. The assembly of the elongated elements preferably involves a certain ordering in space, as opposed to a tangling or an entangling of the elongated elements. The elongated elements of a given type can be assembled in a crisscross manner and/or forming an encircling only with the elongated elements of the same type, or alternatively also with the elongated elements of the other type.

The fact that the sheath is made in the form of an initially substantially planar sheet has a number of advantages.

Such a sheet is a product completely separate from the cable. The sheet can thus be manufactured and stored independently of the cable, and put in place around the cable subsequently, unlike a complex coaxial cable structure including a sheath in the form of a protective layer included in said complex structure. The disclosure thus brings a great simplification in the manufacture and offers more modularity compared to a complex structure in which the sheath is already included.

Furthermore, since the sheet wraps around the cable, passages are easily created in the sheet through which the cable can enter the sheath and come out, for example along the edges of the sheet placed opposite the one from the other when the sheet is in place. Thus, on the one hand, it is not necessary to make openings in the sheath, which would require additional implementation time and could create areas of weakness in the sheath. On the other hand, the passages created by the winding of the sheet can be located in different places of the sheet, for example potentially all along two longitudinal edges of the sheet facing each other once the sheet wound. This offers great flexibility in the positioning of the cable entry and exit areas, and therefore great adaptability to different mounting constraints.

In addition, the sheet, being initially independent of the cable, can be manufactured according to exact needs, corresponding to the shielding that is desired for each case. Thus, the disclosure allows great modularity and great adaptability through the choice of the most appropriate sheath structure, in particular in terms of the means of assembling the elongated elements, choice of the section, etc.

Concretely, the elongated elements of the first type and/or of the second type can be metallic.

The elongated elements of the first type can be made of at least one material having a relative electrical conductivity σr greater than 0.5, preferably greater than 0.6, at room temperature. Said material is for example copper or aluminum. Remember that the relative electrical conductivity σr of a material is a dimensionless number defined as the electrical conductivity of the material divided by the electrical conductivity of copper.

The elongated elements of the second type can be made of at least one material having a relative magnetic permeability $\mu r$ comprised between $\mu r$ min and $\mu r$ max, where, at room temperature, and in a frequency range comprised between 0 Hz and 500 kHz:

$\mu r$ min is equal to 50, preferably 100, better still 200, or even 500;

$\mu r$ max is equal to 7000, preferably 6000, better still 5500, or even 1000.

Remember that the relative magnetic permeability $\mu r$ of a material is a dimensionless number defined as the magnetic permeability of the material divided by the magnetic permeability of vacuum $\mu 0$.

The elongated elements of the second type are for example made of a material belonging to the group formed by: iron, nickel, cobalt and their alloys. Preferably, the elongated elements of the second type are made neither of mumetal nor of permalloy.

The elongated elements may be of round section, or of rectangular section, preferably flattened rectangular. Provision can be made for the elongated elements to belong to the group comprising: wires of round section, flat wires, strips, in particular rolled strips. The term «strip» denotes a narrow and flat strip.

In the sheet, the elongated elements can be assembled by braiding, knitting, weaving, and/or gimping (that is to say the assembly of a core wire with a wire wound around).

Preferably, in the sheet, the elongated elements are substantially contiguous. In other words, the sheet does not have a regular network of holes, as in a trellis.

According to one embodiment, the sheet is configured to be wound around the cable starting from a substantially planar shape. Preferably, the sheath further includes means for holding the sheet in the wound up position. These holding means may be linked to the sheath, or constitute one or more part(s) distinct from the sheath. The holding means may comprise a continuous member or of a series of distinct members. They can be arranged along a generatrix of the sheath, or peripherally to the sheath. The sheet, once wound up, can have substantially adjacent facing edges, or be arranged so as to create a certain overlap on itself, or be wound up over several turns.

According to another embodiment, the initially substantially planar sheet is formed, for example thermoformed, in a pre-wound form having a diameter in the unstressed state, and which, when being placed around a cable, can be elastically deformed by increasing its diameter and elastically return, by reducing its diameter, to a position of use. In other words, a user will enlarge the sheath, insert it and release it around the cable, the sheath then automatically rewinding itself. In the use position, the sheath may have a diameter greater than the diameter it presents in the unstressed state, thus ensuring a certain tightening of the cable, or a diameter close to the diameter of the cable with little or no tightening.

The sheet can be configured to be wound about an axis substantially parallel to the longitudinal axis of the sheet. In other words, the sheet is wound around the cable, about the axis of the cable, like a cigarette. For this embodiment, preferably, the sheet has a width—perpendicular to the longitudinal axis—which is at least equal to the perimeter of the cable.

Alternatively, the sheet may form a tape which is configured to be wound around the cable forming contiguous turns or with an overlap, so that the longitudinal axis of the sheet forms a helix. This embodiment is particularly advantageous for a cable of large diameter, which, with a sheet wound like a cigarette, would require a sheath of great width. In practice, with this embodiment, the sheet has, for example, a width in the range of 25 to 50 mm.

According to a possible embodiment, the elongated elements of the first type and the elongated elements of the second type are assembled together in a same layer of the sheath.

According to another possible embodiment, the elongated elements of the first type are located in a first layer of the sheath and the elongated elements of the second type are located in a second layer of the sheath, distinct from the first layer, coaxial with the first layer, and preferably located on the inner side of the first layer. The elongated elements located in the same layer can be assembled together in a crisscross fashion and/or be wound around the cable. For example, the outer layer is made on the inner layer, so that the inner layer acts as a support for the outer layer, so that the outer layer also blocks the inner layer. The two layers are thus linked and held by the tensions of the materials which oppose each other during production.

The sheath may further comprise elongated elements made of a polymer material. These can be assembled to the elongated elements of the first and/or the second type by crisscross assembly in the same layer of the sheath, or be located in an additional separate layer of the sheath. These elongated polymer elements can be wires, strips, etc. They can be assembled in any of the ways discussed above. These elongated polymer elements provide mechanical reinforcement to the sheath.

The sheath may further include an external textile layer configured to provide mechanical protection and electrical insulation. This textile layer is preferably placed in a second step, around the elongated elements of the first and second types.

The sheath may further include connectors made of an electrically conductive material and assembled to the flexible tubular casing formed by the elongated elements. It may in particular be an eyelet terminal, this not being limiting.

The connectors can also have magnetic properties (and for this purpose contain iron and/or nickel). The sheath can thus comprise an end connector, at each of the longitudinal ends of the flexible tubular casing, and/or at least one intermediate connector, located at a distance from each of the longitudinal ends of the flexible tubular casing. According to an embodiment, the sheath is made in the form of a closed tube in which a cable can be inserted.

The sheath may have at least one orifice, distinct from the axial ends of the sheath, configured to allow passage of the cable. If the sheath is formed from a wound sheet, this orifice can be formed by a localized spacing of the facing edges of the sheet. Preferably, the sheath has two such openings: thus, a central part of the cable can be housed in the sheath, while the end portions of the cable can be located outside the sheath and electrically connected to the member or the appropriate equipment.

According to a second aspect, the disclosure concerns an assembly comprising a sheath as described above and a cable at least partly housed in the sheath.

According to one possible embodiment, the internal diameter of the sheath is substantially equal to the external diameter of the cable. This is understood to mean that the inside diameter of the sheath is at most equal to 1.1 times the external diameter of the cable.

In order to improve the efficiency of the shielding, provision can be made for the section—more precisely the conductive metal section—of the sheath to be greater than $1/10^{th}$, preferably greater than $1/5^{th}$, better still greater than $1/3$, the cross section of the cable—more precisely the conductive cross section of the cable.

According to a third aspect, the disclosure concerns an installation comprising a metal chassis, a current generator including a positive terminal and a negative terminal, an equipment, such as an electric motor, electrically connected to the chassis, and an assembly as previously describe. Furthermore, in this installation, the sheath includes a connector made of an electrically conductive material assembled at each of the ends of the flexible tubular casing formed by the elongated elements, one of the connectors being connected to the negative terminal of the generator and the another to the chassis, the sheath including a first and a second orifices distinct from the ends of the flexible tubular casing. In addition, the cable has a central part housed in the sheath between the two orifices thereof, and passes through the orifices so as to have two end portions located outside the sheath, an end portion being electrically connected to the positive terminal of the generator and the other end portion being electrically connected to the equipment of the installation, the cable preferably being disposed substantially adjacent to the chassis, at least in its central part.

Such an installation can be a vehicle, in particular a hybrid vehicle.

BRIEF DESCRIPTION OF THE DRAWINGS

Several possible embodiments of the disclosure are now described, by way of non-limiting examples, with reference to the appended figures.

DETAILED DESCRIPTION OF THE DRAWINGS

Figure 1:
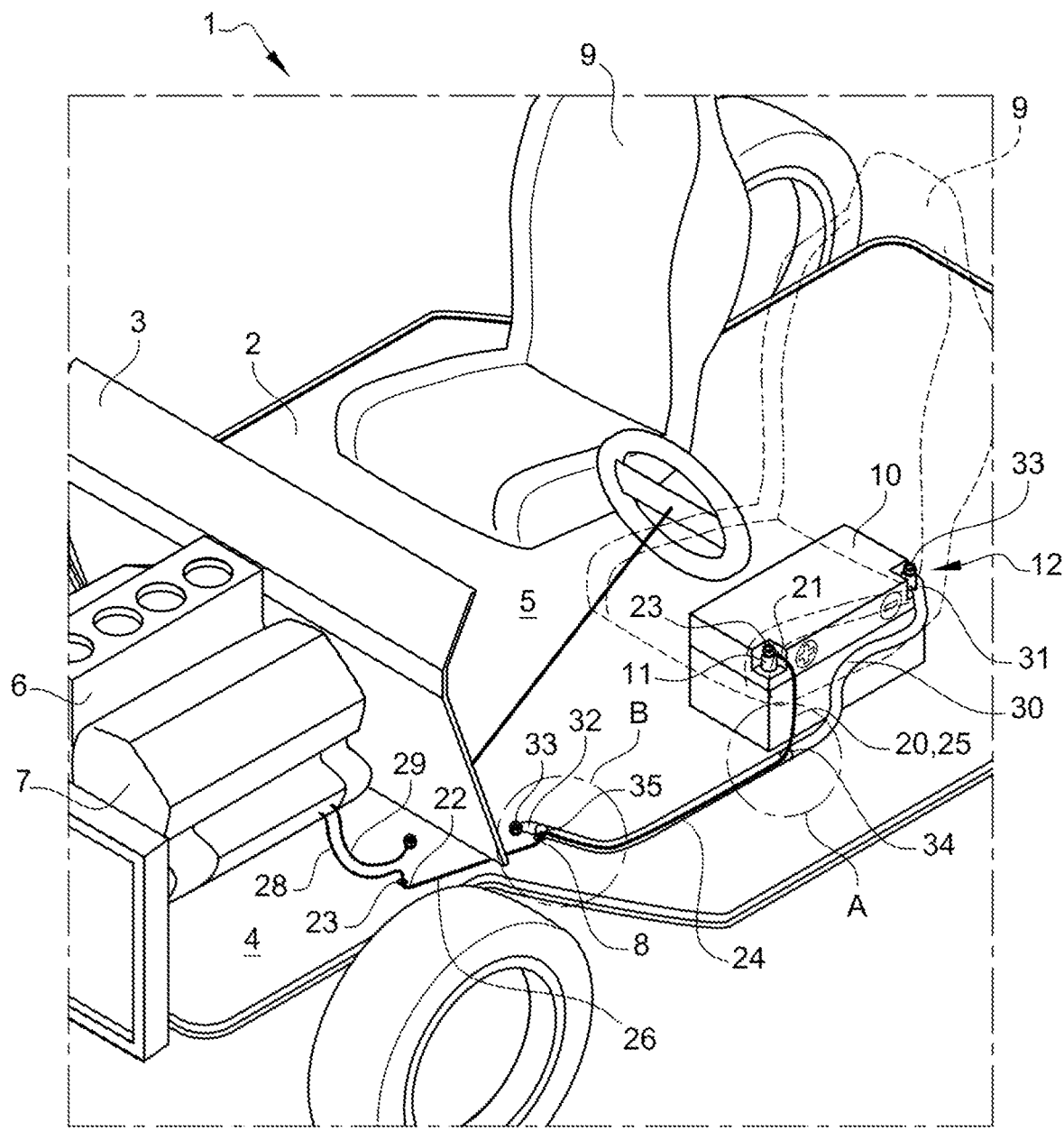
FIG. 1 is a schematic perspective view of a vehicle passenger compartment comprising a cable partly housed in a magnetic shielding sheath according to the disclosure.

FIG. 1 schematically and partially represents a vehicle 1.

The vehicle 1 includes a chassis 2 which is generally formed from the assembly, in particular by welding, of several parts which can be made of different metals, more or less good conductors of electricity. In addition to these metal parts, the chassis 2 can also include non-metal parts, for example made of carbon fibers. The chassis 2 has welded areas, as well as perforations or slits, to meet the different requirements in terms of anchoring and passages through partitions in the vehicle 1. The chassis 2 forms a ground plane for the vehicle 1, and it follows from the above that this ground plane is heterogeneous.

As seen in FIG. 1, a partition 3 fixed to the chassis 2 separates an engine compartment 4, at the front of the vehicle 1, from a passenger compartment 5 where the driver and any passengers will be seated.

In the case of a hybrid vehicle, the engine compartment 4 includes a heat engine 6 and an electric motor 7. A generator 10 allows powering the electric motor 7. This generator 10, typically a battery, can be installed in the passenger compartment 5, under a seat 9. The generator 10 includes a positive terminal 11 and a negative terminal 12.

The electric motor 7 is supplied by the generator 10 by an electric circuit which includes a cable 20 forming the outgoing electrical conductor and a sheath 30 forming the return electrical conductor.

The cable 20 has a first end 21, preferably provided with a connector 23, electrically connected to the positive terminal 11, and a second end 22, preferably provided with a connector 23, electrically connected to the electric motor 7 (or to a conductor 28 itself connected to the electric motor 7).

The sheath 30 forms a flexible tubular casing which partially houses the cable 20, and which has a first end 31 electrically connected to the negative terminal 12 of the generator 10 and a second end 32 electrically connected to the chassis 2. Preferably, a connector 33 is assembled at each of the ends 31, 32 of said casing of the sheath 30.

The end connectors 23, 33 are made of an electrically conductive material, which may further exhibit magnetic properties favorable to the shielding effect. These may be eyelet terminals, as illustrated for example in FIGS. 1 and 12, screwed onto terminal 11, 12 or chassis 2. Other embodiments of such connectors are possible. In particular, the connector could be formed of a plate, for example obtained by flattening a tube, welded or otherwise mechanically and electrically connected to the cable 20 or to the sheath 30.

Figure 2:
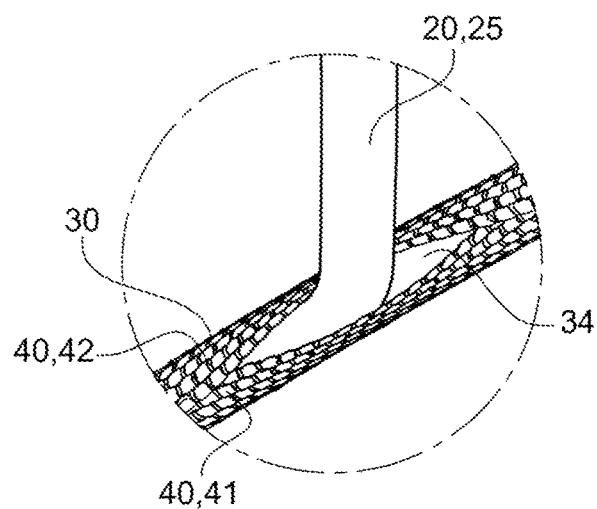
FIG. 2 is an enlarged view of detail A of FIG. 1.
Figure 3:
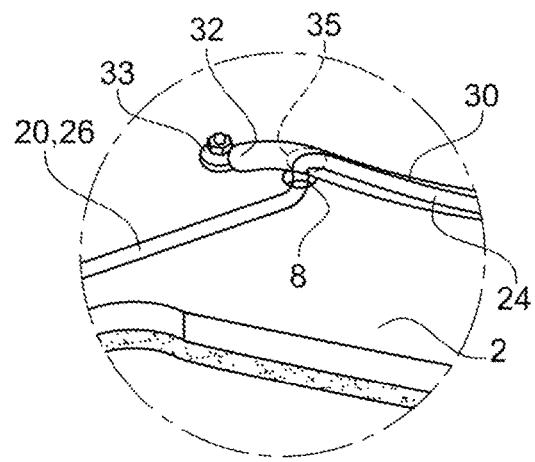
FIG. 3 is an enlarged view of detail B of FIG. 1.

In the embodiment represented in FIGS. 1 to 3, the sheath 30 includes a first orifice 34 and a second orifice 35 separate from the ends 31, 32 of the flexible tubular casing, and spaced from each other. The cable 20 has a central portion 24 housed in the sheath 30 between the two orifices 34, 35 thereof, and passes through the orifices 34, 35, the cable 20 thus having two end portions located outside the sheath 30. More specifically, the cable 20 may have a first end portion 25 between the first end 21 of the cable 20 and the central portion 24 of the cable 20, which, in the mounted position, extends from the positive terminal 11 of the generator 10 to the orifice 34 of the sheath 30; and a second end portion between the second end 22 of the cable 20 and the central portion 24 of the cable 20, which, in the mounted position, extends from the orifice 35 to the conductor connected to the electric motor 7.

The sheath 30 aims to ensure a magnetic shielding of the cable 20, that is to say to form a barrier to the magnetic field emitted by the cable 20, when it is traversed by a current, in order to protect the equipment and people in the environment of the cable 20. It is therefore preferable that the cable 20 is largely housed in the sheath 30, at least in a space where equipment or people to be protected are located.

By way of example, and depending on the layouts and applications, the central portion 24 of the cable 20, housed in the sheath 30, may have a length of at least half, or even at least two thirds, of the total length of the cable 20. This central portion 24 of the cable 20 preferably corresponds to the portion of the cable located in the passenger compartment 5 of the vehicle 1.

As seen in FIGS. 1 to 3, the cable 20 is preferably disposed substantially adjacent to the chassis 2, at least in its central portion 24. The orifice 34 may be located in the upper portion of the sheath 30, to simplify the path of the first end portion 25 of the cable 20 to the positive terminal 11 of the generator 10. Moreover, the orifice 35 can be located in the lower portion of the sheath 30 and opposite an orifice 8 formed in the chassis 2. The cable 20 can thus exit through the orifice 35 of the sheath 30 and through the orifice 8 of the chassis 2, to pass from the interior of the passenger compartment 5 to the area located under the chassis 2, from one side of the partition 3 to the other, up to engine compartment 4.

The second end 32 of the sheath 30 may be located in the passenger compartment 5, the connection with the electric motor 7 being effected via the chassis 2 and a conductor 29 connected on the one hand to the electric motor 7 and on the other hand to the chassis 2, usually in the engine compartment 4.

The fact of placing the cable 20, in the sheath 30, in the vicinity of the chassis 2, may result from the constraint of available space in the passenger compartment 5. This arrangement is advantageous in that it makes it possible to reduce the loop surface (that is to say the surface between the cable 20 and the ground plane). On the other hand, as the proximity of a heterogeneous chassis 2 tends to degrade the effectiveness of the shielding, it is important that the disclosure provides a sheath having sufficient magnetic capacities.

The sheath 30 includes or is formed of an assembly of elongated elements 40 which may be wires, in particular wires of round section or flat wires, strips, in particular rolled strips, or the like.

The sheath 30 includes:
on the one hand, elongated elements 41 of a first type which are made of at least one electrically conductive material, in order to ensure the return of the current through the sheath 30 from the electric motor 7 to the negative terminal 12 of the generator 10;
and on the other hand elongated elements 42 of a second type, different from the first type, made of at least one material having sufficient magnetic properties to produce the shielding effect.

The elongated elements 41 of the first type can be made of at least one material having a relative electrical conductivity σr greater than 0.5, preferably greater than 0.6, at room temperature. These elongated elements 41 can comprise or be made of copper or aluminum.

The elongated elements 42 of the second type can be made of at least one material having a relative magnetic permeability μr which, at room temperature, and in a range of frequencies between 0 Hz and 500 kHz, can be comprised between 50 and 7000. Preferably, this relative magnetic permeability μr can be greater than 100, better still 200, or even 500. Preferably, this relative magnetic permeability μr can be less than 6000, better still 5500, or even 1000. These elongated elements 42 can comprise or be produced from iron, nickel, cobalt, or an alloy including at least one of these metals. Preferably, it is neither mumetal nor permalloy.

In practice, it is possible to determine the range of frequencies of the disturbing magnetic field, and to deduce therefrom the most suitable material, that is to say generally that having the greatest relative magnetic permeability in this range.

The assembly of the elongated elements 40, 41, 42 in the sheath 30 is obtained by crisscross assembly and/or encircling.

Figure 6:
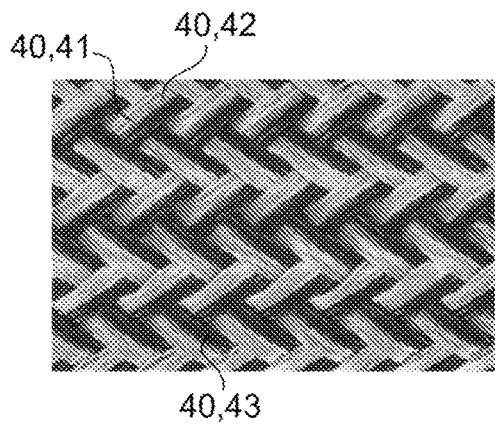
FIG. 6 is a schematic view of an assembly mode of elongated elements in the sheath.
Figure 7:
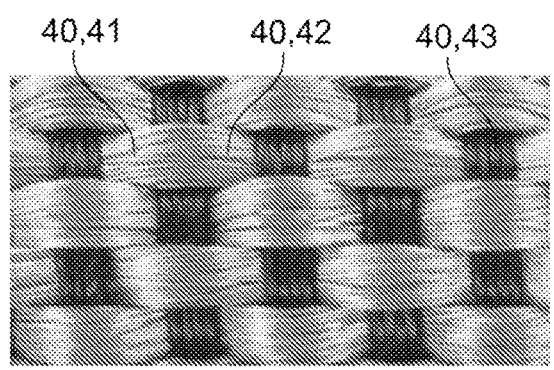
FIG. 7 is a schematic view of another assembly mode of elongated elements in the sheath.
Figure 8:
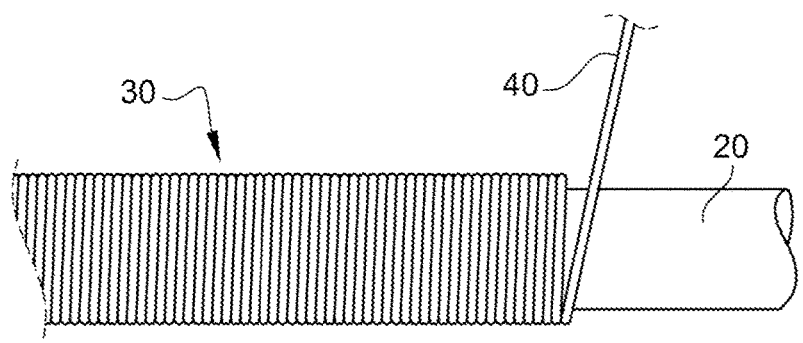
FIG. 8 is a schematic view of an assembly mode of elongated elements of the sheath around the cable.
Figure 9:
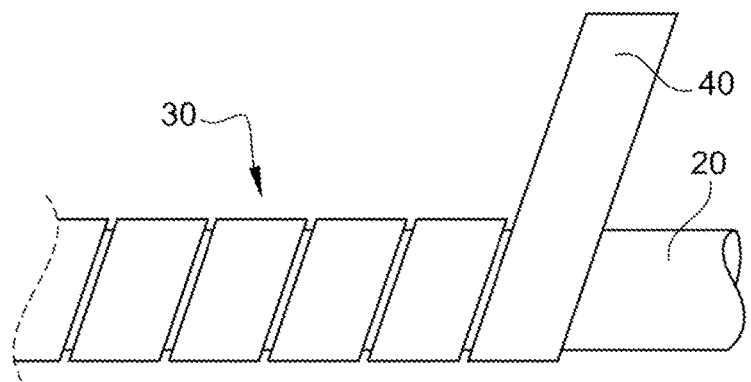
FIG. 9 is a schematic view of another assembly mode of elongated elements of the sheath around the cable.

Thus, the elongated elements 40 can be assembled by braiding (FIG. 6 illustrating an example of braiding), by weaving (FIG. 7 illustrating an example of weaving). The elongated elements 40 can moreover be assembled by winding with contiguous turns (as illustrated in FIG. 8) or by wrapping (as illustrated in FIG. 9). Other assembly methods can be used, such as knitting and gimping.

Figure 4:
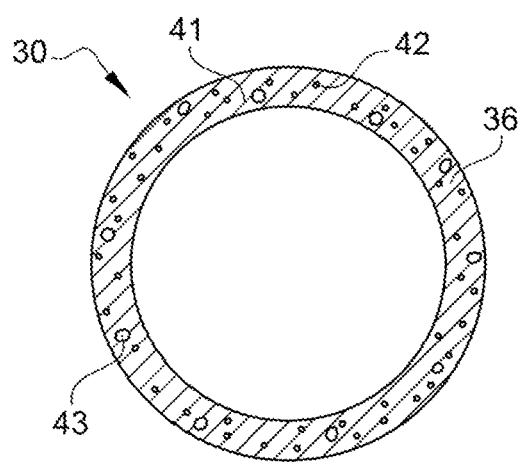
FIG. 4 is a schematic view of the section of a sheath according to one embodiment of the disclosure.

According to one embodiment, as illustrated schematically in FIG. 4, the elongated elements 41 of the first type and the elongated elements of the second type 42 are assembled together in the same layer 36 of the sheath 30.

Figure 5:
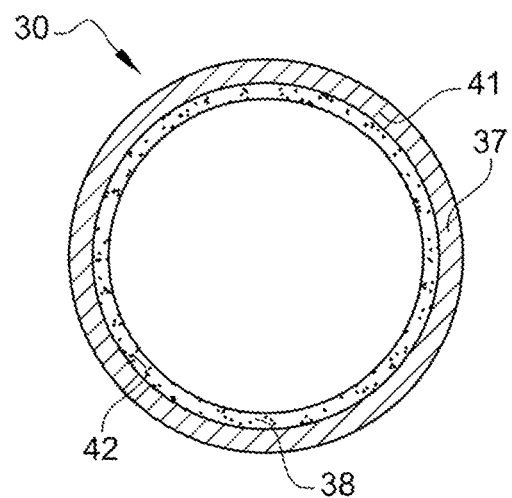
FIG. 5 is a schematic view of the section of a sheath according to another embodiment of the disclosure.

According to another embodiment, as illustrated schematically in FIG. 5, the elongated elements 41 of the first type are located in a first layer 37 of the sheath 30, while the elongated elements 42 of the second type are located in a second layer 38 of the sheath 30, distinct from the first layer 37, and coaxial with the first layer 37. In order to improve the shielding efficiency, it is preferable that the magnetic layer, that is to say here the second layer 38 including the elongated elements 42 of the second type, is located as close as possible to the cable, therefore inside the first layer 37.

Furthermore, still with the aim of improving the shielding efficiency, the internal diameter of the sheath 30 can be substantially equal to the external diameter of the cable 20, so that the elongated elements 42 of the second type are located as close as possible to the cable 20.

Sufficient shielding can be obtained by providing a conductive metal section of the sheath 30 greater than $1/10^{th}$ of the conduction section of the cable 20. By choosing a section of the sheath 30 greater than ⅓ of the section of the cable 20, the shielding is very effective. For example, for a cable 20 with a section equal to 70 mm², it is possible to opt for a sheath 30 whose section (that is to say the transverse surface in the form of a ring) is 25 mm². For even greater efficiency, provision can be made for the section of the sheath 30 to be greater than half the section of the cable 20, which, for a cable 20 of section equal to 70 mm², would result in a sheath 30 of a section of at least 35 mm².

The sheath 30 may further include elongated elements 43 made of a polymer material, such as multifilament or monofilament fibers, as schematically illustrated in FIG. 4. These elongated polymer elements 43 can be assembled with the elongated elements 41, 42 of the first and/or of the second type by crisscross assembly in the same layer 36 of the sheath 30, or be located in an additional layer distinct from the sheath 30 (this embodiment not being represented). Such elongated polymer elements 43 can provide mechanical reinforcement, which may prove to be important when the elongated elements 41, 42 of the first and/or of the second type are very fine threads (for example from 0.03 to 0, 20 mm).

For example, as illustrated in FIG. 6, respectively FIG. 7, there can be a braiding, respectively a weaving between:
- a first kind of strands comprising elongated elements 41 of the first type and elongated elements 42 of the second type;
- and a second kind of strands comprising elongated elements 43 made of a polymer material.

Nonetheless, other assemblies of elongated elements between them are possible. In particular, the type or types of the elongated elements contained in a given kind of strand could be different.

Figure 16:
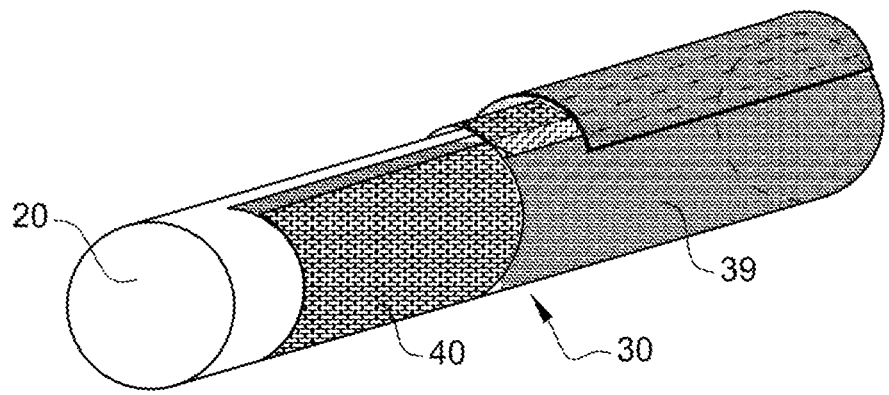
FIG. 16 illustrates an alternative embodiment of a sheath according to the disclosure, placed around a cable.

Moreover, the sheath 30 can also comprise an external textile layer 39 (an exemplary embodiment being illustrated in FIG. 16). Such a textile layer makes it possible to confer mechanical protection and electrical insulation.

We are now interested in the different configurations that the sheath 30 can have.

According to one embodiment, as illustrated in FIGS. 4 and 5, the sheath 30 is produced in the form of a closed tube in which the cable 20 can be inserted, the tube being obtained from an initially substantially flat sheet. Once the cable 20 has been inserted, the connectors 33 can be put in place.

In FIG. 8, the elongated elements 40 are wound around the cable 20.

According to another embodiment, the sheath 30 is produced in the form of an initially substantially flat sheet, suitable for being wound around the cable 20. The sheet can be woven, braided, knitted, etc. The sheet can be made flat, or result from flattening by rolling a tubular structure.

In FIG. 9, the sheet has the shape of a ribbon, that is to say with a width significantly smaller than its length. The sheet is wound around the cable 20 by forming contiguous turns or with an overlap.

As a variant, the sheet includes two free edges 51, 52 which, in the mounted position of the sheath 30, may be arranged substantially longitudinally, that is to say along the axis of the cable 20 and of the sheath 30. In the mounted position, the free edges 51, 52 can be arranged edge to edge or, as a variant, the sheet can be wound over more than one turn and thus have an overlap. Furthermore, preferably, holding means are provided to hold the sheet in the position wound around the cable 20.

Figure 10:
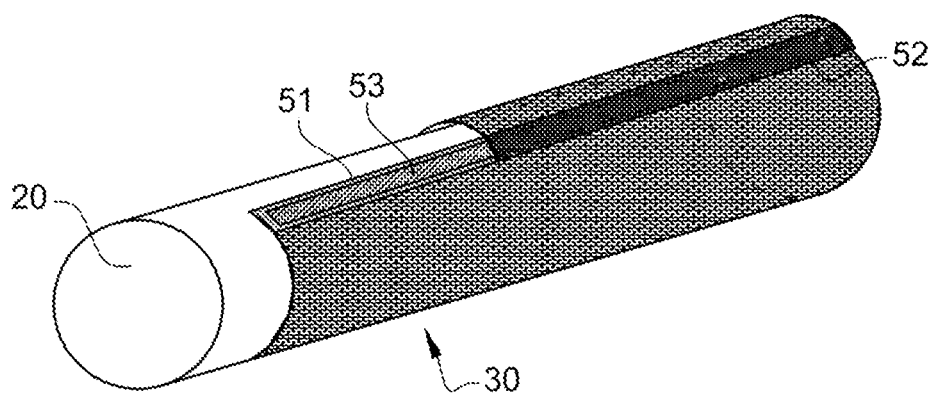
FIG. 10 represents a cable and a sheath placed around the cable according to one embodiment.

In FIG. 10, the sheet is wound over a little more than one turn, so that there is an overlap between the end bands of the sheet each located along one of the free edges 51, 52. The holding means are constituted by self-gripping means 53, such as a part carrying loops and a part carrying hooks of a Velcro® system, these parts being fixed (for example sewn) on the sheet near the free edges 51, 52, in the overlap area. Other holding means could be provided as a variant, such as press studs, rivets, zippers, etc.

Figure 11:
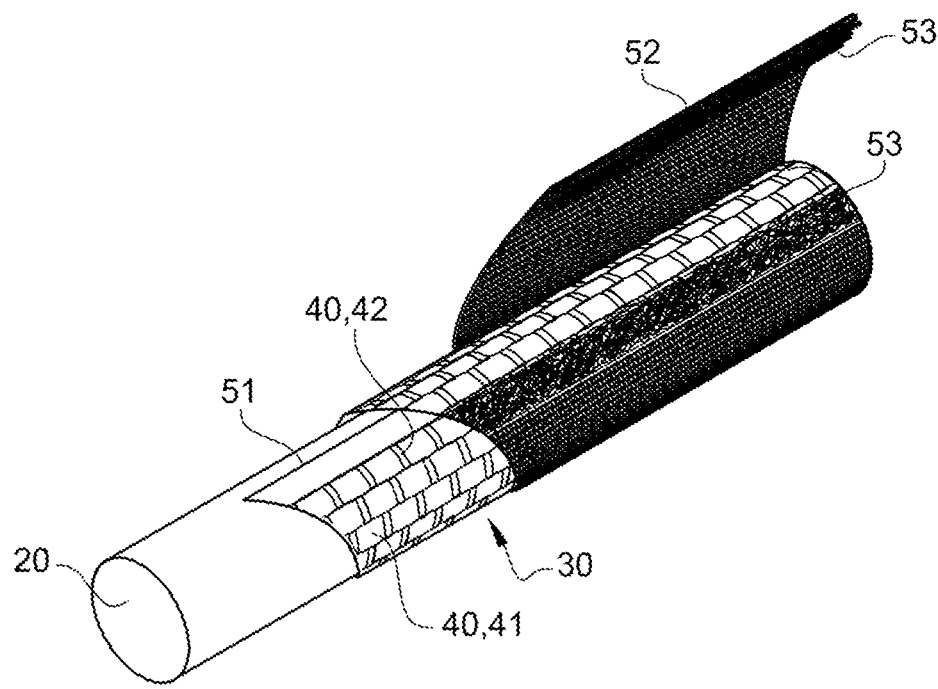
FIG. 11 represents a cable and a sheath placed around the cable according to another embodiment.

In FIG. 11, the sheet is wound in several turns around the cable 20, then attached by self-adhering means 53, for example, to form the sheath 30.

Figure 12:
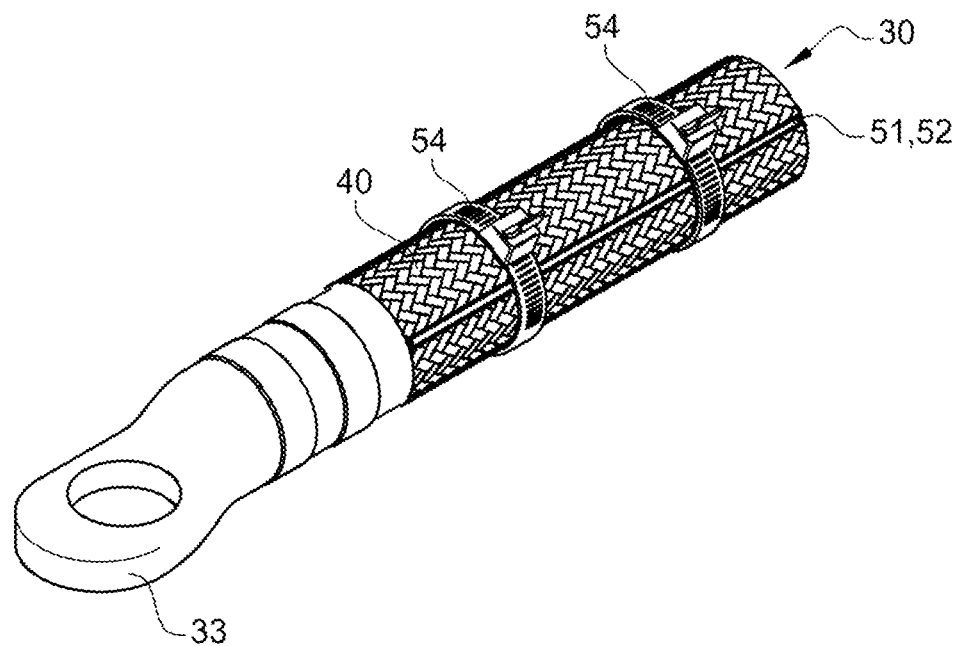
FIG. 12 represents a cable and a sheath placed around the cable according to yet another embodiment.
Figure 13:
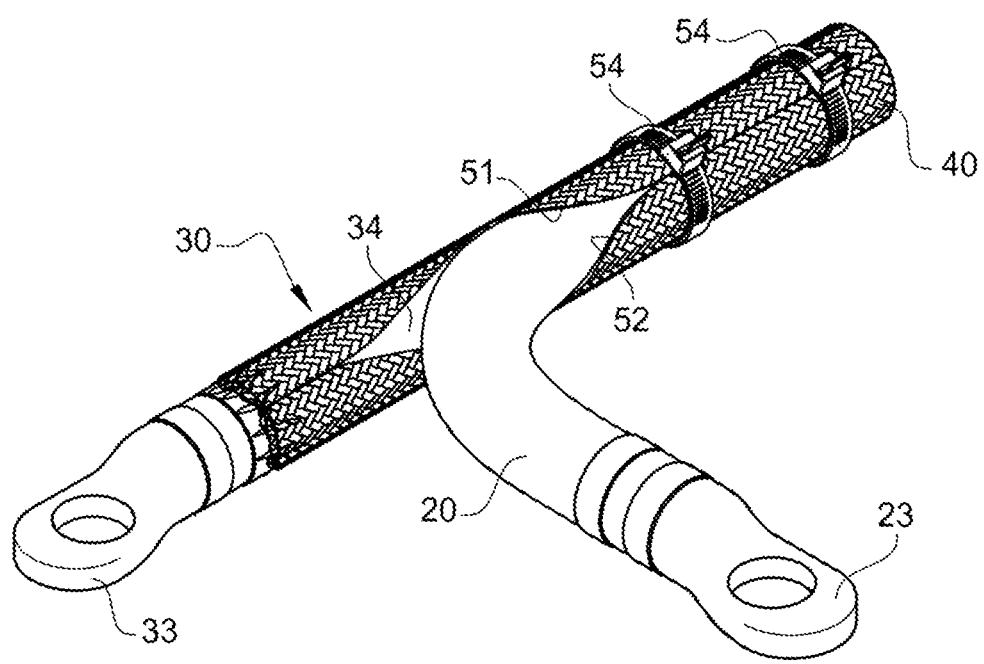
FIG. 13 is a view similar to FIG. 12, showing an end portion of the cable coming out of the sheath.

In FIG. 12, the holding means are formed by one or more links 54 surrounding the sheath 30 and tightening it around the cable 20. These may for example be metal or plastic ligature collars. The free edges 51, 52 of the sheet may be substantially opposite and contiguous, or there may be a certain overlap as in FIG. 10. FIG. 13 illustrates how, by locally separating the free edges 51, 52 of the sheet, an orifice 34 is created in the sheath 30 for the passage of the cable 20.

Figure 14:
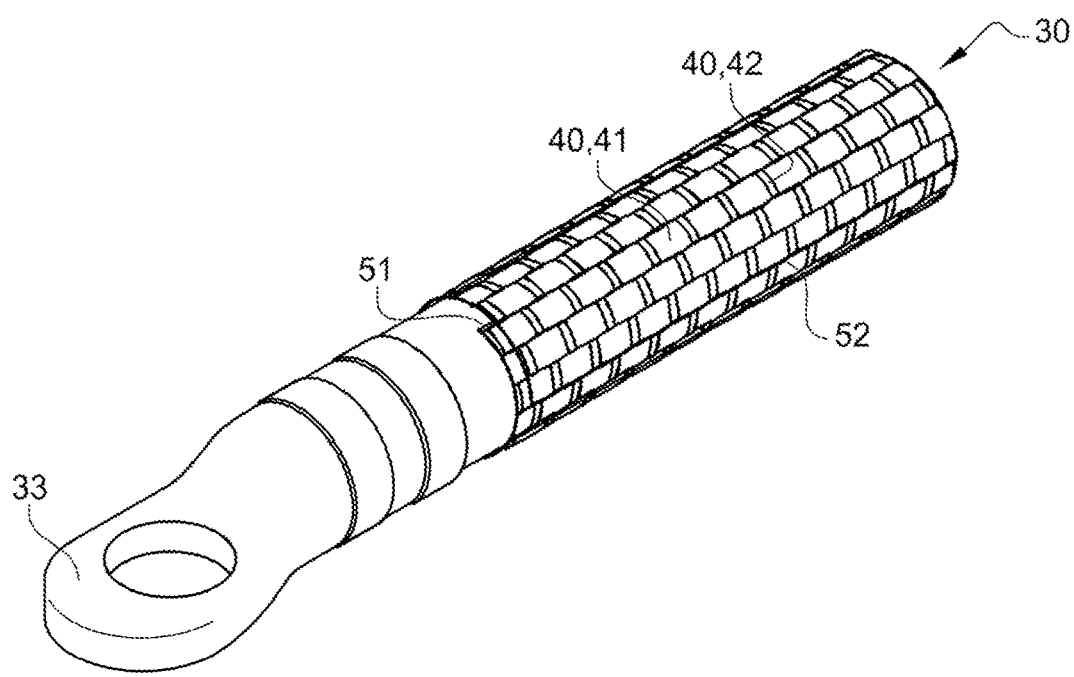
FIG. 14 represents a cable and a sheath positioned around the cable according to yet another embodiment.
Figure 15:
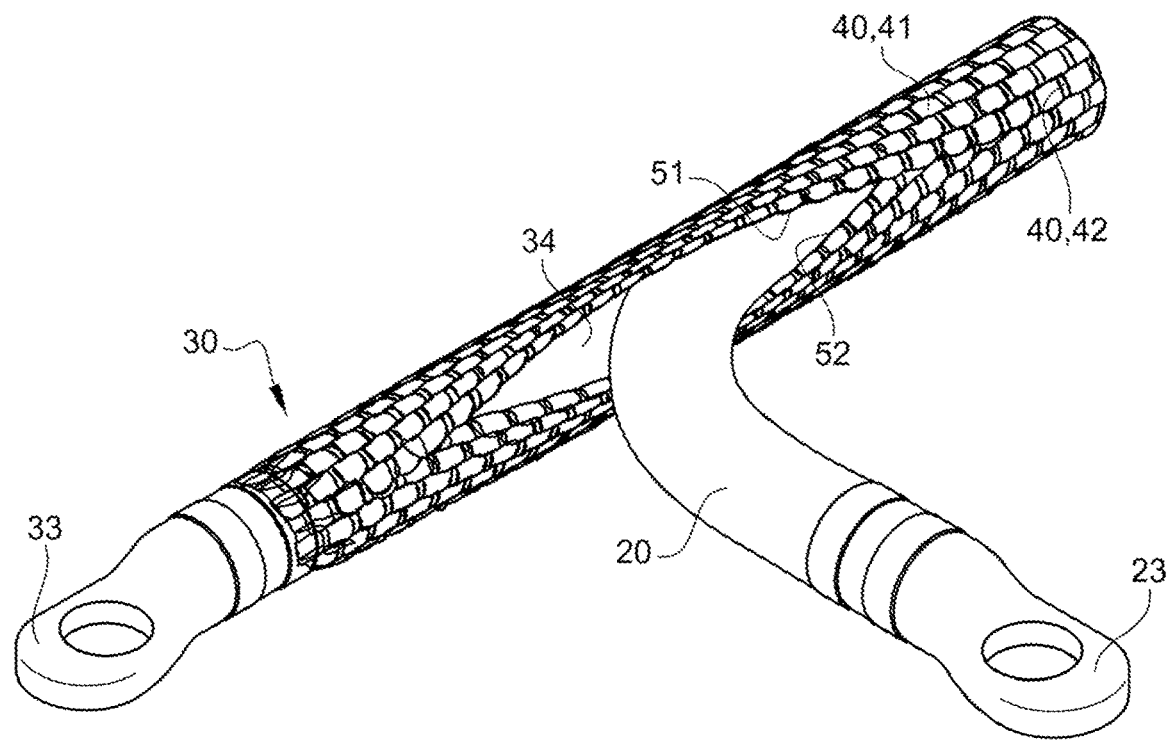
FIG. 15 is a view similar to FIG. 14, showing an end portion of the cable coming out of the sheath.

According to yet another embodiment, illustrated in FIGS. 14 and 15, the sheath 30 is produced in the form of an initially substantially planar sheet which is formed, for example thermoformed, in a pre-wound form having a certain diameter at the unstressed state. When installing around a cable, this pre-wound sheet is elastically deformed, so as to increase its diameter, then it is placed around the cable 20. When the sheet is released, it returns elastically towards its position in the unstressed state, but not necessarily up to this position, by reducing its diameter. Thus, in the position of use, the sheet forms a sheath 30 surrounding the cable, possibly with a certain tightening. This configuration of the sheath 30 is advantageous on account of the ease of implementation.

Similar to the embodiment of FIG. 13, FIG. 15 shows the creation of an orifice 34 for the passage of the cable 20 by localized spacing of the free edges 51, 52 of the sheet which forms the sheath 30.

Finally, FIG. 16 shows a sheath 30 comprising a layer 38 including the elongated elements 41, 42 of the first and of the second type, this layer being able to take any one of the shapes described above, as well as an external textile layer 39. In the represented embodiment, the external textile layer 39 can be produced in the form of an initially substantially flat sheet, and be wound around the cable 20 and held by suitable holding means. These holding means are represented in the form of self-gripping means 53, but this should not be considered as limiting.

It goes without saying that the disclosure is not limited to the embodiments described above by way of examples but that it comprises all the technical equivalents and the variants of the means described as well as their combinations.

In particular, although the disclosure has been described in the context of a hybrid vehicle, it can be applied to an installation other than a vehicle, with an equipment other than an electric motor, for the magnetic shielding of a cable.

The invention claimed is:

1. A magnetic shielding sheath for an electric cable, the sheath forming, in the mounted state, a flexible tubular casing configured to receive the cable, the sheath comprising elongated elements, such as wires or strips, which include:
elongated elements of a first type, made of at least one electrically conductive material, wherein the sheath forms a return conductor for the current carried out by the cable housed in the sheath, such that the current flowing back in the sheath creates a magnetic field opposite to a disturbing magnetic field created by the current flowing in the cable and allows it to be partially attenuated;

elongated elements of a second type, different from the first type, made of at least one material having sufficient magnetic properties to produce the shielding effect against the magnetic field resulting from a sum of the disturbing magnetic field and the field created by the return current in the sheath, said elongated elements being assembled in a crisscross manner and/or forming an encircling, wherein the sheath is produced in the form of an initially substantially flat sheet, capable of being wound around the cable.

2. The sheath according to claim 1, wherein the elongated elements of the first type are made of at least one material having a relative electrical conductivity greater than 0.5, at ambient temperature, said material being copper or aluminum.

3. The sheath according to claim 1, wherein the elongated elements of the second type are made of at least one material having a relative magnetic permeability μr of between μr min and μr max, where, at room temperature, and in a frequency range comprised between 0 Hz and 500 kHz:
μr min is equal to 50;
μr max is equal to 7000.

4. The sheath according to claim 1, wherein the elongated elements of the second type are made of a material belonging to the group formed by: iron, nickel, cobalt and their alloys.

5. The sheath according to claim 1, wherein the elongated elements belong to the group comprising: round section wires, flat wires, and strips.

6. The sheath according to claim 1, wherein, in the sheet, the elongated elements are assembled by braiding, knitting, weaving, and/or gimping.

7. The sheath according to any of claim 1, wherein, in the sheet, the elongated elements are substantially contiguous.

8. The sheath according to claim 1, wherein the sheet is configured to be wound around the cable starting from a substantially planar shape, and in that, the sheath further includes means for holding the sheet in the wound up position.

9. The sheath according to claim 1, wherein the initially substantially planar sheet is formed in a pre-wound form having a diameter in the unstressed state, and which, when placing around a cable, is configured to be elastically deformed by increasing its diameter and return elastically, by reducing its diameter, to a position of use.

10. The sheath according to claim 1, wherein the sheet has a longitudinal axis and in that the sheet is configured to be wound around an axis substantially parallel to the longitudinal axis.

11. The sheath according to claim 1, wherein the sheet has a longitudinal axis and forms a tape which is configured to be wound around the cable by forming contiguous turns or with an overlap, so that the longitudinal axis forms a helix.

12. The sheath according to claim 1, wherein the elongated elements of the first type and the elongated elements of the second type are assembled to each other in the same layer of the sheath.

13. The sheath according to claim 1, wherein the elongated elements of the first type are located in a first layer of the sheath and in that the elongated elements of the second type are located in a second layer of the sheath, distinct from the first layer, coaxial with the first layer.

14. The sheath according to claim 1, further comprising elongated elements made of a polymer material, which are assembled to the elongated elements of the first and/or of the second type by crisscross assembly in the same layer of the sheath, or which are located in an additional layer distinct from the sheath.

15. The sheath according to claim 1, further comprising an external textile layer configured to provide mechanical protection and electrical insulation.

16. The sheath according to claim 1, further including connectors, made of an electrically conductive material and assembled to the flexible tubular casing formed by the elongated elements.

17. The sheath according to claim 1, wherein the sheath is produced in the form of a closed tube in which a cable is configured to be inserted.

18. The sheath according to claim 1, wherein the sheath includes at least one orifice, distinct from the axial ends of the sheath, configured to allow passage of the cable.

19. An assembly comprising a sheath according to claim 1 and a cable at least partially housed in the sheath.

20. The assembly according to claim 19, wherein the internal diameter of the sheath is substantially equal to the external diameter of the cable.

21. The assembly according to claim 19, wherein the section of the sheath is greater than $1/10^{th}$ of the section of the cable.

22. An installation, such as a vehicle, the installation comprising:
a metal chassis;
a current generator comprising a positive terminal and a negative terminal;
an equipment, such as an electric motor, electrically connected to the chassis; and
an assembly according to claim 19;
in which:
the sheath includes a connector made of an electrically conductive material assembled at each of the ends of the flexible tubular casing formed by the elongated elements, one of the connectors being connected to the negative terminal of the generator and the other to the chassis, the sheath including a first and a second orifice distinct from the ends of the flexible tubular casing;
the cable has a central portion housed in the sheath between the two orifices thereof, and passes through the orifices so as to present two end portions located outside the sheath, one end portion being electrically connected to the positive terminal of the generator and the other end portion being electrically connected to the equipment of the installation, the cable being disposed substantially adjacent to the chassis, at least in its central portion.

* * * * *